United States Patent [19]

Smith

[11] Patent Number: 5,619,514
[45] Date of Patent: Apr. 8, 1997

[54] IN-PLACE PRESENT STATE/NEXT STATE REGISTERS

[75] Inventor: David L. Smith, Hummelstown, Pa.

[73] Assignee: Lucent Technologies Inc., Murray Hill, N.J.

[21] Appl. No.: 366,195

[22] Filed: Dec. 29, 1994

[51] Int. Cl.⁶ .................. G06F 11/10; H03M 13/12
[52] U.S. Cl. .................. 371/43; 371/40.4; 375/341
[58] Field of Search .................. 371/30, 37.1, 40.1, 371/40.4, 43, 44; 375/262, 265, 341

[56] References Cited

U.S. PATENT DOCUMENTS

| | | | |
|---|---|---|---|
| 4,493,082 | 1/1985 | Cumberton et al. | 371/43 |
| 4,583,078 | 4/1986 | Shenoy et al. | 341/51 |
| 4,748,626 | 5/1988 | Wong | 371/30 |
| 4,868,830 | 9/1989 | Pollara-Bozzola | 371/43 |
| 5,272,706 | 12/1993 | Park | 371/43 |
| 5,465,275 | 11/1995 | Blaker et al. | 375/341 |

FOREIGN PATENT DOCUMENTS 0127984  5/1984  European Pat. Off. .......... H04L 1/10

*Primary Examiner*—Roy N. Envall, Jr.
*Assistant Examiner*—Emmanuel L. Moise
*Attorney, Agent, or Firm*—David L. Smith

[57] ABSTRACT

A technique for efficiently utilizing memory in determining a next state accumulated cost in a communications system or a Viterbi decoder. The system includes a memory having an array of registers. A first present state accumulated cost is retrieved from a first storage register of the array. A second present state accumulated cost is retrieved from a second storage register of the array. A first next state accumulated cost is calculated based on the first present state accumulated cost. The first next state accumulated cost is stored in the first storage register of the array. An advantage of the invention is that such a technique requires less memory to calculate and store accumulated costs. The number of memory locations required is one for each individual state, which is substantially half of the memory locations required previously.

13 Claims, 3 Drawing Sheets

FIG. 3

PSAC (000)   NSAC (000)
PSAC (001)   NSAC (100)
PSAC (010)   NSAC (001)
PSAC (011)   NSAC (101)
PSAC (100)   NSAC (010)
PSAC (101)   NSAC (110)
PSAC (110)   NSAC (011)
PSAC (111)   NSAC (111)

FIG. 4

PSAC (000)   NSAC (000)
PSAC (100)   NSAC (010)
PSAC (001)   NSAC (100)
PSAC (101)   NSAC (110)
PSAC (010)   NSAC (001)
PSAC (110)   NSAC (011)
PSAC (011)   NSAC (101)
PSAC (111)   NSCA (111)

FIG. 5

PSCA (000)   NSAC (000)
PSAC (010)   NSAC (001)
PSAC (100)   NSAC (010)
PSAC (110)   NSAC (011)
PSAC (001)   NSAC (100)
PSAC (011)   NSAC (101)
PSAC (101)   NSAC (110)
PSAC (111)   NSAC (111)

IN-PLACE PRESENT STATE/NEXT STATE REGISTERS

TECHNICAL FIELD

This invention relates generally to decoders, and particularly to efficient utilization of present state/next state registers, such as in an in-place Viterbi decoder.

BACKGROUND OF THE INVENTION

A Viterbi decoder is a maximum likelihood decoder that provides forward error correction. Viterbi decoders are used to decode a sequence of encoded symbols, such as a bit stream. The bit stream can represent encoded information in a telecommunication system. Such encoded information can be transmitted through various media with each bit (or set of bits representing a symbol instant. In the decoding process, the Viterbi decoder works back through a sequence of possible bit sequences at each symbol instant to determine which one bit sequence is most likely to have been transmitted. The possible transitions from a bit at one symbol instant, or state, to a bit at a next, subsequent, symbol instant or state is limited. Each possible transition from one state to a next state can be shown graphically and is defined as a branch. A sequence of interconnected branches is defined as a path. Each state can transition only to a limited number of next states upon receipt of the next bit (or set of bits) in the bit stream. Thus, some paths survive and other paths do not survive during the decoding process. By eliminating those transitions that are not permissible, computational efficiency can be achieved in determining the most likely paths to survive. The Viterbi decoder typically defines and calculates a branch metric associated with each branch and employs this branch metric to determine which paths survive and which paths dot not survive.

A branch metric is calculated at each symbol instant for each possible branch. Each path has an associated metric, accumulated cost, that is updated at each symbol instant. For each possible transition, the accumulated cost for the next state is calculated as the lesser of the sum of the branch metric for the possible transitions and the path accumulated cost at the respective previous state.

Prior art decoders have used two arrays of registers in a predefined group of memory locations within random access memory to store the present state accumulated costs and next state accumulated cost. The registers of a first array were used to store the present state accumulated costs. As the accumulated costs were calculated for the next symbol instant, the present state accumulated costs were read from registers of the first array and used in the calculations. The calculated accumulated costs for the next symbol instant, or next state, were written to registers of a second array. After all of the accumulated costs for the next state were calculated, the next state accumulated costs were read from a register or location in the second array and written to a corresponding register or location in the first array. This transfer was made in preparation for decoding the next symbol in the bit stream through a subsequent series of calculations to update the accumulated costs at the next state. In this manner, current state accumulated costs were stored in registers of a first array. The next state accumulated costs were calculated and stored in registers of a second array. As a result, at each symbol instant, the operation of reading and writing the contents of the registers of the second array into corresponding registers of the first array was required. Depending on the number of branches, this required a large number of read/write operations. These data transfer operations decrease performance of the decoder both in terms of time lost in unproductive operations and in energy consumption, particularly, in battery powered devices such as mobile telephones.

Other prior art decoders using two arrays of registers have used a pointer to eliminate the data transfer operations. The pointer points to one of the two arrays. As the next state accumulated costs are calculated based on current state accumulated costs stored in registers of one of the arrays, the newly calculated next state accumulated costs are stored in registers of the other array to which the pointer points. When all of the accumulated costs are updated, the pointer is changed to point to the first array and the accumulated costs are updated. While this eliminates the data transfer operations, it still requires twice as many registers as accumulated costs.

A need remains in the art for an efficient way to calculate and store the accumulated costs that eliminates both the unnecessary read and write operations to transfer the accumulated costs from registers of one array to registers of another array and the necessity for twice as many registers as accumulated costs.

SUMMARY OF THE INVENTION

In accordance with the invention, memory is efficiently utilized in a technique for determining a next state accumulated cost in a communications system or a Viterbi decoder. The system includes a memory having an array of registers. A first present state accumulated cost is retrieved from a first storage register of the array. A second present state accumulated cost is retrieved from a second storage register of the array. A first next state accumulated cost is calculated based on the first present state accumulated cost. The first next state accumulated cost is stored in the first storage register of the array. An advantage of the invention is that such a technique requires less memory to calculate and store accumulated costs. The number of memory locations required is one for each individual state, which is substantially half of the memory locations required previously.

BRIEF DESCRIPTION OF THE DRAWING

FIGS. 3, 4 and 5 show a sequence of the contents of present state accumulated cost registers.

DETAILED DESCRIPTION

Figure 1:
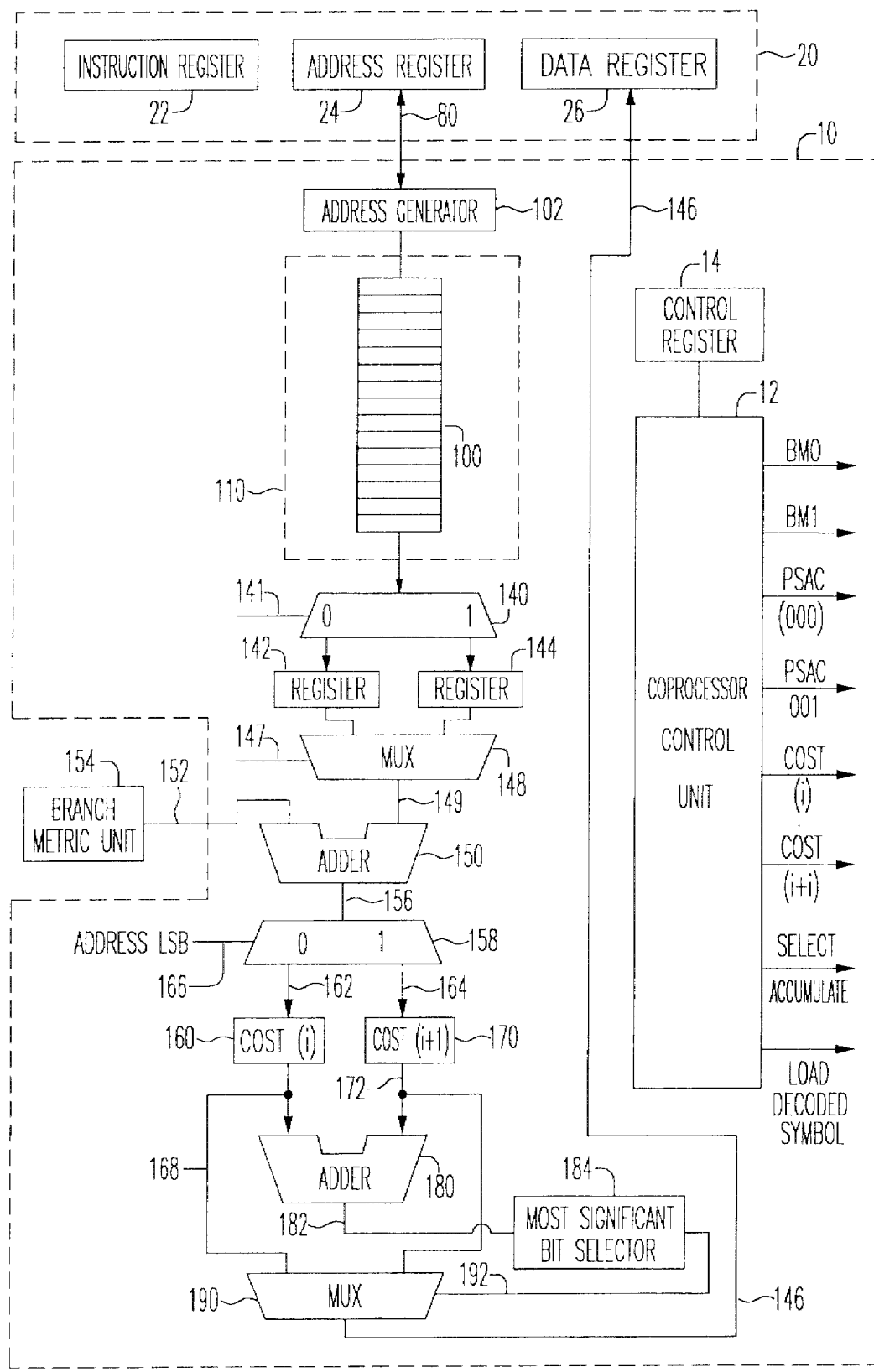
FIG. 1 is a simplified schematic diagram of an illustrative embodiment of the present invention in a digital signal processor with a coprocessor.

FIG. 1 shows an illustrative embodiment of the invention in a communication system such as a digital cellular telephone, modem, satellite communication system, or digital video communication system. In the illustrative embodiment of the invention, an error correction coprocessor 10 is controlled by a digital signal processor (DSP) 20. Error correction coprocessor 10 may be embedded within DSP 20. A portion of the registers of random access memory (RAM) 110 of the coprocessor define array 100. Data from registers of array 100 can be read from that array, processed by adder 150, registers 160 and 170 and adder 180, and resulting data written to registers of array 100. Address generator 102 determines the register or registers of array 100 from which data is read as well as the register or registers of array 100 to which data is written.

An indirect addressing technique is used to write data to and read data from error correction coprocessor 10. To write data to a register at an address in coprocessor 10, an address is written into address register 24 and the data is written to data register 26, both in DSP 20. The address is transferred from the DSP 20 to address generator 102 in coprocessor 10 on address bus 80 and is translated to a translated address of a corresponding register in the coprocessor that is dependent on the output of flip flop 144. Address generator 102 concatenates a bit dependent on the state of flip-flop 144. Methods are well known to concatenate either a most significant bit or a least significant bit to achieve an address translation. The data written to data register 26 is transferred from DSP 20 to the coprocessor memory location identified by the translated address.

To read data from a register at an address in coprocessor 10, an address is written into address register 24 of DSP 20. The address is transferred to address generator 102 and translated as set forth above. The data at the addressed register is read by reading data register 26.

The coprocessor control unit 12 generates a predetermined sequence of signals to control one aspect of operation of the coprocessor, the decoding function. From the disclosed operation of the illustrated embodiment, one of ordinary skill in the art can readily construct the signals produced by coprocessor control unit 12. Operation of the control unit is initiated by a single instruction transferred from the DSP to control register 14 in the manner described above.

An array of memory 100 is identified in random access memory for storage of present state and next state accumulated costs. The binary representation of the present state and next state accumulated costs can take one of many forms. The forms include, but are not limited to: 2's-complement which may be sign extended; sign magnitude; floating point; or a simple binary representation. Array 100 consists of a plurality of addressable memory registers or locations. The number of memory registers in array 100 is sufficient to accommodate at least the greatest number of present state or next state costs required to be calculated. The number of memory registers used in array 100 may be less than the number of memory registers allocated for the array. For a constraint length C, the number of memory registers utilized in the array is $2^{C-1}$.

Array 100 has an associated address generator 102. Address generator 102 enables the memory register from which data is read during a read operation, and also enables the memory location to which data is written during a write operation. The two present state accumulated cost values stored in array 100 utilized to calculate two next state accumulated cost values are read from array 100. The first present state accumulated cost is transferred over data bus 146 to a first register 142. The second present state accumulated cost is transferred over data bus 146 to a second register 144. Which present state accumulated cost values are transferred depends on which next state accumulated cost values are being calculated. See the equations in Table 1. The present state accumulated cost values are transferred by an address taken from a look-up table or by address generator 102 generating the address of a present state accumulated cost, the data stored in a register of array 100 at that address is read and transferred over data bus 146 to the register 142 or 144. Registers 142 and 144 provide first and second inputs to multiplexer 148. A select input 147 determines which input to multiplexer 148 is provided as its output 149. Output 149 provides one of the inputs to adder 150 from the register 142 or 144 coupled through multiplexer 148. The second input to adder 150, input 152, is a branch metric provided by the branch metric unit 154. Each branch metric is needed only once and is calculated as required in any known manner. Output 156 from adder 150 is coupled to and provides the input to demultiplexer 158. The least significant bit of the address from which the cost is read may provide the select input 166 to demultiplexer 158. For example, for even addresses, demultiplexer 158 provides the input 156 as output 162. For odd addresses, demultiplexer provides input 156 as output 164. Output 162 is coupled to and provides the input to register 160. Output 164 is coupled to and provides the input to register 170.

The output 168 of register 160 is coupled to and provides one of the inputs to adder 180. The output 172 of register of 170 is coupled to and provides the other input to adder 180. Adder 180 subtracts input 172 from input 168. Output 168 from register 160 and output 172 from register 170 are coupled to and provide the inputs to multiplexer 190. The most significant bit of output 182 is determined by most significant bit selector 184 and provided as the select input 192 to multiplexer 190. Select input 192 selects one of the inputs 168 or 172 to multiplexer 190 as its output to place on data bus 146.

In decoding encoded data using the Viterbi decoder from the series of binary data received at the decoder, the decoder reconstructs the sequence of data most likely transmitted. The received data may include errors. The initial state of the encoder is known so the decoder has a staffing point. The end state of the encoder may also be known, and when known, the decoder also has a predetermined ending point. The decoder must determine the most likely sequence of state transitions for the received series of binary data. Each such state represents a symbol instant. At each state or symbol instant, there are a number of states that range from zero up to $2^{C-1}-1$ where C is the constraint length. These $2^{C-1}$ states will be referred to as individual states. A limited number of transitions are possible. At each symbol instant, the accumulated cost is calculated and stored for each of the possible transitions.

At each symbol instant, each individual state in the illustrative embodiment of the invention can transition only to two possible next individual states, although the invention is not so limited. Concomitantly, each next individual state has only two possible previous individual states from which a transition to it can originate. Other decoders could have more than two transitions to a next state.

A branch metric is calculated at each symbol instant for each possible transition from one individual state to the next individual state. Various methods for calculating branch metrics are known in the art. The branch metric of both branches transitioning to a given next individual state are calculated, then added to the accumulated cost of the respective originating individual state, resulting in two potential accumulated cost sums. A comparison is made of the two potential accumulated cost sums. An extremum sum is selected as the next state accumulated cost. In the illustrative embodiment, an extremum sum that is the lesser of two sums is described, although the invention is not so limited. The transition corresponding to the lesser sum is the more likely transition from the two possible originating individual states to the given next individual state. The originating individual state of the more likely transition is stored as the surviving origin of a branch to the given next individual state. The lesser sum is the accumulated cost of the next individual state and replaces the accumulated cost for that individual state. This process is repeated for each of the next individual states and repeated also for each symbol instant until all symbols in the bit stream are decoded.

Figure 2:
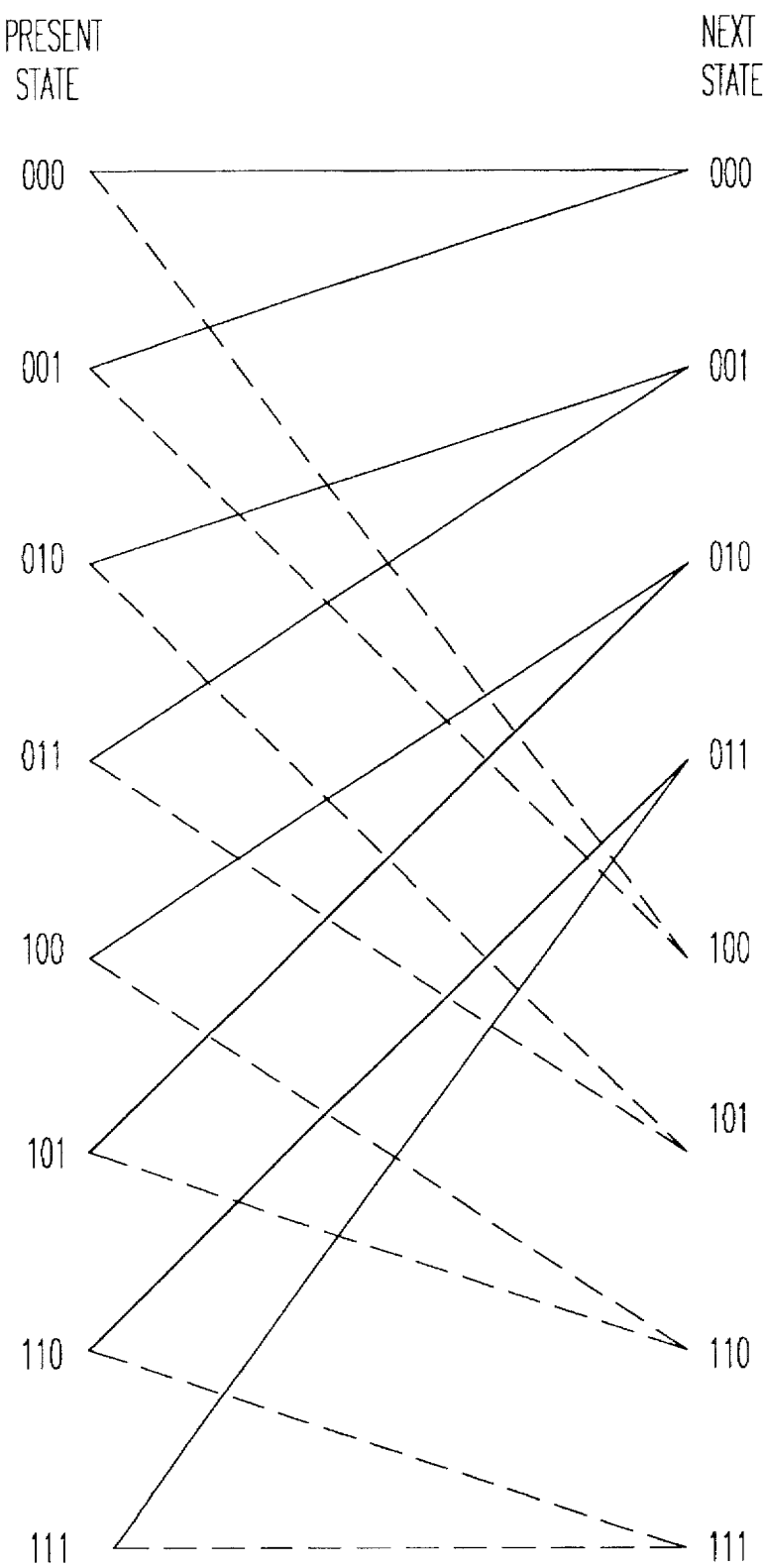
FIG. 2 is a state transition diagram for a constraint length of four.

By way of example, for a constraint length of four, there are $2^{4-1}$, or eight, individual states. A state transition diagram is shown in FIG. 2. The solid lines represent a transition to the next state when the next bit in the series is a zero, and a broken line represents a transition to the next state when the next bit in the series is a one. The equations for calculating the next state accumulated costs for each of the eight individual states of FIG. 2 are shown in Table 1.

NSAC(000)=Lesser {PSAC(000)+BM(000), PSAC(001)+BM(001)}

NSAC(001)=Lesser {PSAC(010)+BM(010), PSAC(011)+BM(011)}

NSAC(010)=Lesser {PSAC(100)+BM(100), PSAC(101)+BM(101)}

NSAC(011)=Lesser {PSAC(110)+BM(110), PSAC(111)+BM(111)}

NSAC(100)=Lesser {PSAC(000)+BM(000), PSAC(001)+BM(001)}

NSAC(101)=Lesser {PSAC(010)+BM(010), PSAC(011)+BM(011)}

NSAC(110)=Lesser {PSAC(100)+BM(100), PSAC(101)+BM(101)}

NSAC(111)=Lesser {PSAC(110)+BM(110), PSAC(111)+BM(111)}

TABLE 1 Next State Accumulated Cost Equations

Although the same symbol has been used for the branch metric in the upper half and lower half of the table, it is understood that different numerical quantities are represented. In the illustrative embodiment, the branch metric in the upper half of Table 1 is due to receipt of a zero whereas the branch metric in the lower half of the Table 1 is due to receipt of a one.

Recognizing that pairs of the next state accumulated cost equations include the same two present state accumulated cost values lends itself to some efficiency in calculating and storing the next state accumulated cost values. NSAC(000) and NSAC(100) are functions of PSAC(000) and PSAC(001). NSAC(001) and NSAC(101) are functions of PSAC(010) and PSAC(011), and so forth. More specifically, the next state accumulated cost for individual state 000, NSAC(000), is the lesser of the present State accumulated cost for individual state 000, PSAC(000), and the branch metric for branch 000, BM(000), or the present state accumulated cost for individual state 001, PSAC(001) and the branch metric for branch 001, BM(001). The same present state accumulated costs, but different branch metrics, are used to calculate the next state accumulated cost for individual state 100. The next state accumulated cost for individual state 100, NSAC(100), is the lesser of the present state accumulated cost for individual state 000, PSAC(000), and the branch metric for branch 000, BM(000), or the present state accumulated cost for state 001, PSAC(001) and the branch metric for branch 001, BM(001). This calculation is repeated for all individual states until all next state costs are calculated at a given symbol instant. Calculation of the next state accumulated costs is achieved utilizing the circuit of FIG. 1. The present state accumulated costs are stored in array 100, for example starting at the first memory location (e.g. address 000) therein, and may be initialized with the first memory location having a value of zero and subsequent memory locations having a very large negative value. Initially, the accumulated costs are typically stored in sequential memory registers.

Address generator 102 generates an address and enables the register identified by the address to be read. A read operation transfers the accumulated cost for individual state 000 from a memory register in array 100 to the data bus 146. Data bus 146 provides the accumulated cost for individual state 000 through demultiplexer 140 to one of two registers 142 or 144, as determined by select input 141. For this example, assume the accumulated cost of individual state 000 is transferred to register 142. Address generator 102 generates the address for the accumulated cost for individual state 001 and reads the accumulated cost from a memory register i array 100 to the date bus 146. Date bus 146 provides the accumulated cost for individual state 001 to the other of the two registers 142 or 144, such as register 144, as determined by select input 141. The two accumulated cost values stored in registers 142 or 144 are used to calculate two next state accumulated costs, for individual states 000 and 100.

Multiplexer 148, as determined by select input 147, provides the accumulated cost stored in register 142 as its output 149. Output 149 provides one operand input to adder 150. The other input to adder 150 is the branch metric for branch 000, as calculated by the branch metric unit 154. The sum output from adder 150 provides the input to demultiplexer 158. The least significant bit of the address of the present state accumulated cost may be used as a select input to demultiplexer 158 to cause demultiplexer 158 to select output 162 and provide the output 156 from adder 150 as the input to register 160. Output 162 is transferred to and stored temporarily in register 160. This sum will be referred to as COST(i).

Select input 147 then selects the other register, register 144, to couple to adder 150 through multiplexer 148. Output 149 provides an input to adder 150. The other input to adder 150, provided by the branch metric unit 154, is the calculated branch metric for state 001. The sum output from adder 150 provides the input to demultiplexer 158. The least significant bit of the address of the present state accumulated cost may be used as a select input to demultiplexer 158 to cause demultiplexer 158 to select output 172 and provide the output 156 from adder 150 as the input to register 170. Output 164 is transferred to and stored temporarily in register 170, and will be referred to as COST(i+1).

The lesser of these two sums, COST(i) and COST(i+1), is selected to replace the present state accumulated cost for state 000 and represents the accumulated cost at the next state or next symbol instant. The lesser of COST(i) and COST(i+1) is determined by comparing the two sums and selecting the smaller one. COST(i) provides one input operand to adder 180; the other input operand is COST(i+1). Adder 180 subtracts COST(i) from COST(i+1), providing output 182 as the difference therebetween. If COST(i+1)is greater than COST(i), the most significant bit of output 182 will be 1 representing a negative sign. Otherwise, the most significant bit will be 0. Most significant bit selector 184 selects the most significant bit of output 182 and provides the most significant bit as output 192. Output 192 is the select input to multiplexer 190. The select input determines which accumulated cost input, input 168 or input 172, to multiplexer 190 is selected as the lesser cost and is provided to data bus 146. When COST(i+1) is greater than COST(i), the most significant bit is 1 causing multiplexer 190 to select input 168, which is the smaller input to adder 180, to place on data bus 146. Otherwise, the most significant bit is 0 causing multiplexer 190 to select input 168, which is COST(i), to place on data bus 146. In this manner, adder 180 and most significant bit selector 184 function as a comparator to select the smaller accumulated cost, COST(i) or COST(i+1), and provide that smaller accumulated cost to data bus 146. Address generator 102 enables the register in array 100 that the accumulated cost for individual state 000 was read from. This overwrites data in a register in array 100 that has no further value. Typically, the next state accumulated cost is stored in the register of array 100 from which one of the present state accumulated costs was read for use in calculating the next state accumulated cost. Each register in the present state array is thus read once in the process of calculating the next state accumulated costs.

The next state accumulated cost for individual state 100 is calculated. The present state accumulated costs for individual states 000 and 001 continue to be stored in registers 142 and 144 respectively. One of the same costs in array 100 was overwritten. As described above, the accumulated cost stored in register 142 is provided as one input operand to adder 150 through multiplexer 148. The branch metric unit 154 calculates and provides the branch metric for branch 000 as the other input operand to adder 150. The sum output from adder 150 provides the input to demultiplexer 158. The least significant bit of the address of the present state accumulated cost may be used as a select input to demultiplexer 158 to cause demultiplexer 158 to select output 162 and to provide the output 156 from adder 150 as the input to register 160. Output 162 is transferred to and stored temporarily in register 160 as COST(i).

Select input 147 then selects the other register, register 144, containing the present state accumulated cost for individual state 001 to couple to adder 150 through multiplexer 148. Output 149 provides an input to adder 150. The other input to adder 150 is the calculated branch metric for state 001 provided by the branch metric unit 154. The sum output from adder 150 provides the input to demultiplexer 158. The least significant bit of the address of the present state accumulated cost May be used as a select input to demultiplexer 158 to cause demultiplexer 158 to select output 192 and provide the output 156 from adder 150 as the input to register 170. Output 164 is transferred to and stored temporarily in register 170 as COST(i+1).

The lesser of COST(i) and COST (i+1) is selected to replace the present state accumulated cost for state 001. Adder 180 subtracts COST(i+1) from COST(i), the most significant bit selector 184 provides the most significant bit as the select input to multiplexer 190. Multiplexer 190 selects the lesser of COST(i) and COST (i+1) and provides the lesser cost to data bus 164. The memory register in array 100 where the present state accumulated cost for state 100 was stored is enabled by address generator 102 and the next state accumulated cost is written to that register. The decoder is then ready to decode the next symbol. This process is repeated until all of the next state accumulated costs have been calculated for the individual states such that there is a next state accumulated cost stored in the registers in array 100 for each individual state.

In this manner, the accumulated cost in each of the $2^{C-1}$ registers of array 100 that store accumulated costs are updated from a present state accumulated cost to a next state accumulated cost. When the update is complete, next state is designated as the present state and the process is repeated. This cycle continues through the number of symbol instants or states of data being decoded.

FIGS. 3, 4, and 5 shows the next state accumulated cost that replaces the present state accumulated cost for the illustrative embodiment case of C=4. There are eight individual states.

Data is transferred between DSP 20 and coprocessor 10 by way of a data register 24. DSP 20 can read from or write to any of the memory registers of coprocessor 10. Memory registers of the coprocessor are indirectly addressed by placing a memory register address in address register 24 of DSP 10. Address generator 102 receives the address from address register 24 on address bus 80. In a read operation, coprocessor 10 then transfers the contents of the addressed coprocessor memory register to the receive data register where it can be read by DSP 20. Through a sequence of such operations, the entire array of accumulated costs can be transferred to DSP 20.

It can be seen from FIG. 3 that with the present state accumulated costs initially in numerical order from binary zero to binary seven, the next state accumulated costs are not in the same numerical order. In base 10, the next state accumulated costs for the illustrative embodiment case of C=4 are in the order 0; 4; 1; 5; 2; 6; 3; 7. With all of the accumulated costs updated in FIG. 3, the accumulated costs designated next state accumulated cost in FIG. 3 are designated as the present state accumulated costs the next subsequent state shown in FIG. 4. When the next state accumulated costs are calculated the order is again changed. The new order is 0; 2; 4; 6; 1; 3; 5; 7. With all of the accumulated costs updated the next state of accumulated cost in FIG. 4 are designated present state accumulated cost in FIG. 5. When the next state accumulated costs are evaluated in FIG. 5, the next state accumulated costs are back in the original numerical order. This can be generalized to communicate that each C-1 states the accumulated costs will be in sequential numerical order. If decoding stops at a multiple of C-1, there is no need to reorder the accumulated costs. However, if the number of bits, or sets of bits, transmitted is not a multiple of the C-1, it will be necessary to reorder the accumulated costs at the conclusion of decoding a series of bits or sets of bits. Alternatively, the accumulated costs can be retained in the nonsequencial order of the resulting calculations and the user can compensate the address upon access.

If decoding ends in the next state shown in FIG. 3, the accumulated costs can be read out of the array in ascending individual state order in two passes. On a first pass, starting with the individual state 000, which remains first, alternate registers can be read. On the second pass, alternate registers are read beginning with the register following individual state 000.

If decoding ends in the next state shown in FIG. 4, the accumulated costs can be read out of the array in ascending individual state order in four passes. On a first pass, starting with the individual state 000, each fourth register is read. On the second pass, each fourth register is read beginning from a register indexed one higher from individual state 000. On the third pass, indexed from a starting point that is one register higher than the starting point of the second pass, each fourth register is read. On the fourth pass, starting from a register that is indexed one register higher than the starting point of the third pass, each fourth register is read.

If decoding ends in the next state shown in FIG. 5, the accumulated costs can be read out in ascending individual state order in a single pass. This is due to 3 being an integral multiple of C-1, where C in the illustrative embodiment case is 4. The order of next state accumulated costs in the array is predetermined based on parameter C and how many states or symbol instants have been decoded beyond an integral multiple of C-1.

The invention is particularly useful in communication systems and equipment employing integrated circuits including this technique. Such communications systems and equipment has the advantages of reducing memory requirements. In one respect, this advantage is achieved by not needlessly reading the contents of registers in one array and writing them to registers of a second array.

While the illustrative embodiment of the invention has not been described as incorporating pipelining, one skilled in the art would recognize the enhanced computational efficiency available by utilizing pipelining in the design. Pipelining is achieved by initiating computation with a new data set before completing computations with a previous set of data. The more latches used in pipelining, the greater the depth of pipelining. Pipelining causes an initial latency in computation time required to fill the pipeline, but maximizes usage of resources such as adders and subtractors.

I claim:

1. A method of efficiently utilizing memory in determining which next state accumulated cost to retain in a communication system having an array of registers, the method comprising the steps of:

retrieving a first present state accumulated cost from a first storage register of the array;

retrieving a second present state accumulated cost from a second storage register of the array;

calculating a first next state accumulated cost based on one of said and second present state accumulated costs; and storing the first next state accumulated cost in said first storage register of the array.

2. A method of efficiently utilizing memory in determining which next state accumulated cost to retain as recited in claim 1, further comprising the step of:

storing the first present state accumulated cost in a first temporary register.

3. A method of efficiently utilizing memory in determining which next state accumulated cost to retain as recited in claim 1, further comprising the step of:

storing the second present state accumulated cost in a second temporary register.

4. A method of efficiently utilizing memory in determining which next state accumulated cost to retain as recited in claim 1, further comprising the steps of:

calculating a second next state accumulated cost based on the second present state accumulated cost; and storing the second next state accumulated cost in said second storage register of the array.

5. A method of efficiently utilizing memory in determining which next state accumulated cost to retain as recited in claim 1, further comprising the steps of:

retrieving a third present state accumulated cost from a third storage register of the array;

retrieving a fourth present state accumulated cost from a fourth storage register of the array;

calculating a third next state accumulated cost based on the third present state accumulated cost; and storing the third next state accumulated cost in a said third storage register of the array.

6. An integrated circuit for processing signals, comprising:

an array of registers;

means for retrieving a first present state accumulated cost from a first register of the array;

means for retrieving a second present state accumulated cost from a second register of the array;

means for calculating a first next state accumulated cost based on one of said first and second present state accumulated costs; and means for storing the first next state accumulated cost in said first register of the array.

7. An integrated circuit as recited in claim 6, wherein the storage means comprises random access memory.

8. An integrated circuit as recited in claim 6, wherein the calculating means comprises an adder.

9. An integrated circuit as recited in claim 6, wherein the calculating means comprises a comparator.

10. In a Viterbi decoder for determining an extremum next state accumulated cost for each possible transition at a series of symbol instants, said decoder including an array comprised of storage registers, a method for determining which next state cost to retain comprising the steps of:

retrieving a first accumulated cost associated with a first present state from a first storage register;

adding the first accumulated cost associated with the first present state to a first branch metric resulting in a first potential accumulated cost;

retrieving a second accumulated cost associated with a second present state from a second storage register;

adding the second accumulated cost to a second branch metric resulting in a second potential accumulated cost;

selecting an extremum of the first and second potential accumulated costs as a next state accumulated cost; and storing the next state accumulated cost in the first storage register.

11. A method for determining the extremum next state accumulated cost as recited in claim 10, wherein selecting the smaller of the first and second potential accumulated costs as the next state accumulated cost, comprises:

subtracting one of the first and second potential accumulated costs from the other resulting in a difference;

identifying the most significant bit of a binary representation of the difference; and determining the smaller of the first and second potential accumulated costs as the next state accumulated cost by the most significant bit of the binary representation of the difference.

12. A method for determining the extremum next state accumulated cost as recited in claim 10, further comprising the step of:

calculating a branch metric corresponding to a transition from the present state to a next state.

13. A method for determining the extremum state accumulated cost as recited in claim 10, wherein the extremum is the smaller of the first and second potential accumulated costs.

* * * * *